(12) United States Patent
Feng et al.

(10) Patent No.: US 11,843,358 B2
(45) Date of Patent: Dec. 12, 2023

(54) GAIN COMPENSATION DEVICE AND BIAS CIRCUIT DEVICE

(71) Applicant: RADROCK (SHENZHEN) TECHNOLOGY CO., LTD., Guangdong (CN)

(72) Inventors: Jinghao Feng, Guangdong (CN); Jianxing Ni, Guangdong (CN)

(73) Assignee: RADROCK (SHENZHEN) TECHNOLOGY CO., LTD., Shenzhen (CN)

( * ) Notice: Subject to any disclaimer, the term of this patent is extended or adjusted under 35 U.S.C. 154(b) by 301 days.

(21) Appl. No.: 17/439,442

(22) PCT Filed: Aug. 12, 2020

(86) PCT No.: PCT/CN2020/108602
§ 371 (c)(1),
(2) Date: Sep. 15, 2021

(87) PCT Pub. No.: WO2021/227275
PCT Pub. Date: Nov. 18, 2021

(65) Prior Publication Data
US 2022/0311402 A1      Sep. 29, 2022

(30) Foreign Application Priority Data

May 13, 2020 (CN) .......................... 202010403432.2

(51) Int. Cl.
*H03G 3/30* (2006.01)
*H03F 3/21* (2006.01)

(52) U.S. Cl.
CPC ................ *H03G 3/30* (2013.01); *H03F 3/21* (2013.01); *H03F 2200/15* (2013.01); *H03F 2200/447* (2013.01)

(58) Field of Classification Search
CPC .......... H03G 3/30; H03G 3/3042; H03F 3/21; H03F 2200/15; H03F 2200/447; H03F 1/0261; H03F 1/30
(Continued)

(56) References Cited

U.S. PATENT DOCUMENTS 9,667,203 B2 * 5/2017 Li .......................... H04B 1/3827
10,230,335 B2    3/2019 Rabjohn et al.
(Continued)

FOREIGN PATENT DOCUMENTS

CN      101895259 A    11/2010
CN      102073334 A    5/2011
(Continued)

*Primary Examiner* — Emmanuel Bayard

(57) ABSTRACT

Provided are a gain compensation device and a bias circuit device. A compensation bias current is generated by the gain compensation device to compensate the gain deviation of power amplifier and improve stability of power amplifier. Through high-temperature compensation unit and low-temperature compensation unit in different gears, gain of power amplifier is compensated along with temperature changes, thereby improving feasibility of the gain compensation device. It takes small space, and the circuit only includes the circuits corresponding to high-temperature compensation unit and low-temperature compensation unit, so the circuit is relatively simple and beneficial to miniaturization. In the bias circuit device, based on an initial bias current provided by a bandgap reference, the gain compensation device is added to generate a compensation bias current, and the initial bias current and compensation bias current are superimposed, so that the gain of power amplifier is further compensated, which improves stability of power amplifier.

19 Claims, 2 Drawing Sheets

(58) Field of Classification Search
USPC .................................................. 375/297, 345
See application file for complete search history.

(56) References Cited

U.S. PATENT DOCUMENTS

| | | | | |
|---|---|---|---|---|
| 11,251,752 | B2* | 2/2022 | Najjari | H03F 1/0261 |
| 2007/0146047 | A1* | 6/2007 | Senriuchi | G01D 3/036 |
| | | | | 327/512 |
| 2015/0054587 | A1* | 2/2015 | Yoshizaki | H03F 3/195 |
| | | | | 330/296 |
| 2015/0180518 | A1* | 6/2015 | Whittaker | H03F 1/56 |
| | | | | 330/296 |
| 2018/0115287 | A1* | 4/2018 | Rabjohn | H03F 1/02 |

FOREIGN PATENT DOCUMENTS

| | | | | |
|---|---|---|---|---|
| CN | 102541133 | A | | 7/2012 |
| CN | 103412606 | A | | 11/2013 |
| CN | 104977969 | A | | 10/2015 |
| CN | 105320199 | A | | 2/2016 |
| CN | 107425815 | A | | 12/2017 |
| CN | 111294004 | A | | 6/2020 |
| CN | 111665898 | A * | 9/2020 | ............. G05F 1/567 |
| JP | 2015222878 | A * | 12/2015 | |
| WO | 2019078529 | A1 | 4/2019 | |

\* cited by examiner

GAIN COMPENSATION DEVICE AND BIAS CIRCUIT DEVICE

The present application claims the benefit of Chinese Patent Application No. 202010403432.2, filed on May 13, 2020, titled "Gain compensation device and bias circuit device", the contents of which are incorporated herein by reference in their entirety.

TECHNICAL FIELD

The application relates to the field of power amplifier, in particular to a gain compensation device and a bias circuit device.

BACKGROUND

With the development of mobile communication technology, people have higher and higher requirements for power amplifier in communication system. And gain linearity is an important performance index to measure power amplifier, which directly affects the communication quality of mobile terminals.

The inventor realized that the gain of power amplifier is easily affected by external temperature, so it is very important to improve the thermal stability of power amplifier. The prior art adopts the off-chip component to control the bias current or input voltage of the power amplifier to adjust the gain of the power amplifier, so as to compensate the corresponding gain when affected by the external temperature. However, this way has the problem of complex peripheral circuits and takes up a large module space, which is not conducive to miniaturization.

SUMMARY

The embodiments of the present application provide a gain compensation device and a bias circuit device to solve the problem of low thermal stability of power amplifiers.

The application provides a gain compensation device, including at least one high-temperature compensation unit and at least one low-temperature compensation unit;

the gain compensation device is configured for receiving a compensation signal containing a first gain deviation, determining a first compensation gear according to the first gain deviation, and generating a compensation bias current for compensating the first gain deviation through a temperature compensation object corresponding to the first compensation gear; each first compensation gear corresponds to a group of temperature compensation objects, and the temperature compensation object include at least one high-temperature compensation unit or at least one low-temperature compensation unit; the first gain deviation represents a gain deviation between a first actual gain output by a power amplifier and a preset gain, and the gain deviation is caused by the ambient temperature of the power amplifier.

A bias circuit device, including a gain compensation device and a power amplification device, wherein the gain compensation device includes at least one high-temperature compensation unit and at least one low-temperature compensation unit; the power amplification device includes a bandgap reference module and a power amplifier;

output ends of the bandgap reference module, the high-temperature compensation unit and the low-temperature compensation unit are all connected with the power amplifier;

the power amplifier acquires an initial bias current output from the output end of the bandgap reference module, and performs power amplification on the initial bias current to obtain an actual gain;

the gain compensation device is configured for receiving a compensation signal containing a first gain deviation, determining a first compensation gear according to the first gain deviation, and generating a compensation bias current for compensating the first gain deviation through a temperature compensation object corresponding to the first compensation gear; each first compensation gear corresponds to a group of temperature compensation objects, and the temperature compensation object include at least one high-temperature compensation unit or at least one low-temperature compensation unit; the first gain deviation represents a gain deviation between the actual gain output by a power amplifier and a preset gain, and the gain deviation is caused by the ambient temperature of the power amplifier;

and the power amplifier receives the compensation bias current and the initial bias current of superimposed inputs, and compensates the first gain deviation according to the compensation bias current and the initial bias current of superimposed inputs.

A compensation bias current is generated by the above gain compensation device to compensate the gain deviation of power amplifier and improve the stability of the power amplifier. Through the high-temperature compensation unit and low-temperature compensation unit in different gears, the gain of power amplifier is compensated along with the changes of temperature, thereby improving the feasibility of the gain compensation device. The gain compensation device takes small space, and the circuit only includes the circuits corresponding to the high-temperature compensation unit and low-temperature compensation unit, so the circuit is relatively simple and beneficial to miniaturization.

According to the bias circuit device, based on an initial bias current provided by a bandgap reference, the gain compensation device is added to generate a compensation bias current, and the initial bias current and compensation bias current are superimposed, so that the gain of power amplifier is further compensated along with the changes of temperature, which improves the stability of power amplifier.

The details of one or more embodiments of the present application are set forth in the following drawings and description, and other features and advantages of the present application will be apparent from the specification, drawings and claims.

BRIEF DESCRIPTION OF DRAWINGS

In order to illustrate the technical solution of the embodiments of the application more clearly, the drawings used in the embodiments of the application will be briefly described below. Obviously, the drawings in the following description are only some examples of the present application. For those skilled in the art, other drawings can be obtained according to these drawings without creative efforts.

Figure 1:
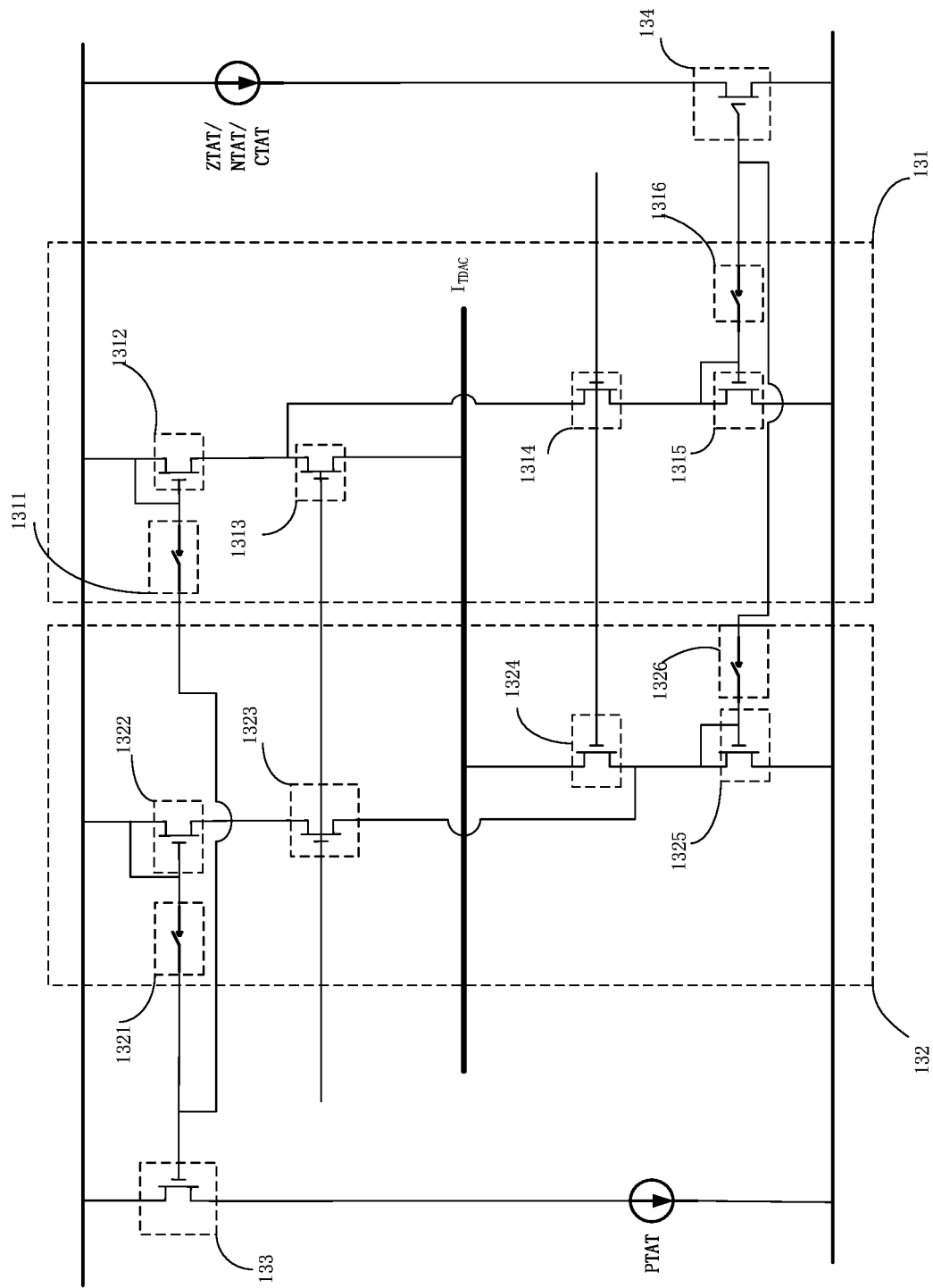
FIG. 1 is a circuit diagram of the high-temperature compensation unit and low-temperature compensation unit of a gain compensation device according to an embodiment of the present application.

Reference Numerals in the Figures are as Follows:

12—power amplification device; 13—gain compensation device; 121—bandgap reference module; 122—power amplifier; 131—high-temperature compensation unit; 132—low-temperature compensation unit; 133—first common transistor; 134—second common transistor; 1311—first switch; 1312—first transistor; 1313—second transistor; 1314—third transistor; 1315—fourth transistor; 1316—second switch; 1321—third switch; 1322—fifth transistor; 1323—sixth transistor; 1324—seventh transistor; 1325—eighth transistor; 1326—fourth switch.

DETAILED DESCRIPTION

The technical solution of the embodiments of this application will be described clearly and completely with reference to the drawings. Obviously, the described embodiments are part of the embodiments of the present application, not all of them. Based on the embodiments of this application, all other embodiments obtained by those skilled in the art without creative efforts fall within the protection scope of this application.

In one embodiment, a gain compensation device 13 is provided, which includes at least one high-temperature compensation unit 131 and at least one low-temperature compensation unit 132.

Gain compensation device 13 is configured for receiving a compensation signal containing a first gain deviation, determining a first compensation gear according to the first gain deviation, and generating a compensation bias current for compensating the first gain deviation through a temperature compensation object corresponding to the first compensation gear; each first compensation gear corresponds to a group of temperature compensation objects, and the temperature compensation object include at least one high-temperature compensation unit 131 or at least one low-temperature compensation unit 132; the first gain deviation represents a gain deviation between a first actual gain output by a power amplifier 122 and a preset gain, and the gain deviation is caused by the ambient temperature of power amplifier 122.

Specifically, high-temperature compensation unit 131 is a unit for compensating the gain deviation of power amplifier 122 in a high temperature environment. Low-temperature compensation unit 132 is a unit for compensating the gain deviation of power amplifier 122 in a low temperature environment. The first gain deviation is in fact the gain deviation between a first actual gain output by power amplifier 122 and a preset gain, and the gain deviation is caused by the ambient temperature of power amplifier 122. The compensation signal is a signal containing a first gain deviation. The first compensation gear includes different types of gears that can provide different gain compensations, and the first compensation gear is determined according to different numbers of high-temperature compensation units 131 or different numbers of low-temperature compensation units 132. The temperature compensation object refers to the object that can provide gain compensation when power amplifier 122 is in different ambient temperatures and needs to be compensated for gain. Understandably, the temperature compensation object can be either high-temperature compensation unit 131 or low-temperature compensation unit 132. The first actual gain is determined according to the electrical signals at the input and output of power amplifier 122. For example, the electrical signals may be power signals. Exemplarily, the first actual gain may be calculated by sampling and then converting the currents at the input and output of power amplifier 122, or, calculated by sampling and then converting other electrical signals of power amplifier 122. The preset gain is the expected gain of power amplifier 122 in an ideal state (for example, when it is not affected by the ambient temperature). The preset gain may be a predetermined value or a gain value of power amplifier 122 measured at a certain temperature (e.g., normal temperature).

Optionally, at any ambient temperature, firstly, the input power signal input to power amplifier 122 is obtained, and at the same time, the output power signal output by power amplifier 122 is obtained, and then the first actual gain is determined according to the ratio of the output power signal to the input power signal. Then determining a first gain deviation according to the difference between the first actual gain and the preset gain. Wherein, the input power signal is the power signal initially input to the input of power amplifier 122, the output power signal is obtained by amplifying the input power signal with power amplifier 122.

Understandably, the first gain deviation is related to the current environmental temperature of power amplifier, that is, the ambient temperature of power amplifier has a correlation relationship with the first gain deviation. Therefore, the first gain deviation represents the gain deviation between the first actual gain output by power amplifier 122 and the preset gain, and the gain deviation is caused by the ambient temperature of power amplifier 122.

Understandably, the correlation between the first gain deviation and the ambient temperature of power amplifier can be measured in advance. The correlations between all the first gain deviations requiring gain compensation and the ambient temperatures of power amplifier can be stored in a deviation table in the database. Therefore, when it is detected that the current environmental temperature matches an environmental temperature in the deviation table, it can be confirmed that gain compensation is required currently. In this case, a compensation signal corresponding to the current environmental temperature is generated, and the compensation signal contains a first gain deviation associated with the current environmental temperature.

Optionally, in another embodiment, a signal transmission unit can be connected between power amplifier 122 and gain compensation device 13. When gain compensation device 13 is connected to power amplifier 122, the first gain deviation corresponding to the current environmental temperature can be transmitted to gain compensation device 13 in the form of a compensation signal by the signal transmission unit.

Further, after gain compensation device 13 receives the compensation signal including the first gain deviation, the temperature compensation object and the specific number of high-temperature compensation units 131 or low-temperature compensation units 132 in the temperature compensation object are determined according to the first gain deviation. A first compensation gear is determined according to the specific number of high-temperature compensation units 131 or low-temperature compensation unit 132 in the temperature compensation object. A compensation bias current is generated by the temperature compensation object corresponding to the first compensation gear, and the compensation bias current is used for compensating the first gain deviation, so that the first actual gain is close to or even equal to the preset gain.

In this embodiment, gain compensation device 13 generates a compensation bias current to compensate the gain deviation of power amplifier 122, and thus improving the stability of power amplifier 122. Through high-temperature compensation unit 131 and low-temperature compensation unit 132 in different gears, the gain of power amplifier 122 is compensated along with the changes of temperature, thereby improving the feasibility of the gain compensation device 13. Gain compensation device 13 takes small space, and the circuit only includes the circuits corresponding to high-temperature compensation unit 131 and low-temperature compensation unit 132, so the circuit is relatively simple and beneficial to miniaturization.

In an embodiment, the step of the first compensation gear is determined according to the first gain deviation includes:

if the first gain deviation is a first deviation, determining that the temperature compensation object only includes the high-temperature compensation unit 131; the first deviation is a negative gain deviation when the first actual gain is less than the preset gain; and determining the number of high-temperature compensation units 131 in the temperature compensation object according to the deviation value of the first deviation, and determining a first compensation gear according to the number of high-temperature compensation units 131.

The first deviation refers to the negative gain deviation between the first actual gain and the preset gain when the first actual gain is smaller than the preset gain.

Specifically, after receiving a compensation signal containing a first gain deviation, comparing the sizes of the first actual gain and the preset gain that the first gain deviation represents; if the first actual gain is smaller than the preset gain ((i.e., the gain deviation between the first actual gain and the preset gain is negative gain deviation), it means that the ambient temperature is high. When power amplifier 122 performs power amplification on the input power signal, it is affected by the high ambient temperature, and the ratio between the output power signal and the input power signal is smaller than the preset gain. Therefore, when the first gain deviation is the first deviation, it is determined that the temperature compensation object is high-temperature compensation unit 131. Understandably, in a high temperature environment, the gain of power amplifier 122 would decrease.

Further, after determining that the temperature compensation object is high-temperature compensation unit 131, the specific number of high-temperature compensation units 131 in the temperature compensation object is determined according to the deviation value of the first deviation (i. e., the number of high-temperature compensation units 131 switched to on-state), and the first compensation gear is determined according to the specific number of high-temperature compensation units 131.

For example, if the deviation value of the first deviation is 30% (i. e., the first actual gain is 30% lower than the preset gain), three high-temperature compensation units 131 may be selected as temperature compensation objects, that is, three high-temperature compensation units 131 may be switched to working state.

In an embodiment, the step of the first compensation gear is determined according to the first gain deviation includes:

if the first gain deviation is a second deviation, determining that the temperature compensation object only includes the low-temperature compensation unit 132; the second deviation is a positive gain deviation when the first actual gain is greater than the preset gain; and determining the number of the low-temperature compensation units 132 in the temperature compensation object according to the deviation value of the second deviation, and determining a first compensation gear according to the number of the low-temperature compensation units 132.

The second deviation refers to the positive gain deviation between the first actual gain and the preset gain when the first actual gain is greater than the preset gain.

Specifically, after receiving a compensation signal containing a first gain deviation, comparing the sizes of the first actual gain and the preset gain that the first gain deviation represents; if the first actual gain is greater than the preset gain ((i.e., the gain deviation between the first actual gain and the preset gain is positive gain deviation), it means that the ambient temperature is low. When power amplifier 122 performs power amplification on the input power signal, it is affected by the low ambient temperature, and the ratio between the output power signal and the input power signal is greater than the preset gain. Therefore, when the first gain deviation is the second deviation, it is determined that the temperature compensation object is low-temperature compensation unit 132. Understandably, in a low temperature environment, the gain of power amplifier 122 would increase.

Further, after determining that the temperature compensation object is low-temperature compensation unit 132, the specific number of low-temperature compensation units 132 in the temperature compensation object is determined according to the deviation value of the second deviation (i. e., the number of low-temperature compensation units 132 switched to on-state), and the first compensation gear is determined according to the specific number of low-temperature compensation units 132.

For example, if the deviation value of the second deviation is 20% (i. e., the first actual gain is 20% higher than the preset gain), two low-temperature compensation units 132 may be selected as temperature compensation objects, that is, two low-temperature compensation units 132 may be switched to working state.

In an embodiment, as shown in FIG. 1, gain compensation device 13 further includes a first power supply, a second power supply, a first common transistor 133 and a second common transistor 134; high-temperature compensation unit 131 includes first switch 1311, second switch 1316, first transistor 1312, second transistor 1313, third transistor 1314 and fourth transistor 1315; the first power supply is connected to the drain of first common transistor 133; the gate of first common transistor 133 is connected to a first end of first switch 1311, and a second end of first switch 1311 is connected to the gate of first transistor 1312; the drain of first transistor 1312 is connected to the source of second transistor 1313 and the drain of third transistor 1314; the source of third transistor 1314 is connected to the drain of fourth transistor 1315; the second power supply is connected to the drain of second common transistor 134; the gate of second common transistor 134 is connected to a first end of second switch 1316; the gate of fourth transistor 1315 is connected to a second end of second switch 1316; the source of fourth transistor 1315 is connected to a ground; the first power supply and second power supply have different temperature coefficients.

Specifically, the first power supply and second power supply may both be current sources, and their temperature coefficients are different. For example, the first power supply may be a PTAT (Proportional To Absolute Temperature) current source, that is, the first power supply may be a current source with positive temperature coefficient. The second power supply may be a NTAT (Negative to Absolute Temperature)/ZTAT (Zero to Absolute Temperature)/CTAT (Complementary to Absolute Temperature) current source, that is, the second power supply may be a current source with negative temperature coefficient or a current source with zero temperature coefficient. In this embodiment, first common transistor 133, first transistor 1312 and second transistor 1313 are all PMOS (P-Metal-Oxide-Semiconductor) transistors. Second common transistor 134, third transistor 1314 and fourth transistor 1315 are all NMOS (N-Metal-Oxide-Semiconductor) transistors, and each transistor includes a drain, gate and source. First switch 1311 and second switch 1316 may be contact switches, that is, when the first contact contacts the second contact of the switch, the switch is in an on-state; when the first contact does not contacts the second contact, the switch is in an off-state. Or, first switch 1311 and second switch 1316 may also be switch transistors composed of MOS transistors. The ground is the ground in the circuit. Understandably, the source of fourth transistor 1315 may also be connected to other low-level ports.

The step of generating a compensation bias current for compensating the first gain deviation through a temperature compensation object corresponding to the first compensation gear includes:

if the temperature compensation object corresponding to the first compensation gear includes a first number of high-temperature compensation units 131, controlling the first number of high-temperature compensation units 131 in the temperature compensation object to an on-state, so as to switch gain compensation device 13 to the first compensation gear corresponding to the first number of high-temperature compensation units 131.

The first number is the number of high-temperature compensation units 131 among all high-temperature compensation units 131 determined to correspond to the first compensation gear. Specifically, after determining the first number of high-temperature compensation units 131 included in the temperature compensation object, all high-temperature compensation units 131 in the temperature compensation object are controlled to switch to a connection state, that is, the circuit part characterizing high-temperature compensation unit 131 is in a working state. Further, according to the first number of high-temperature compensation units 131 included in the temperature compensation object, gain compensation device 13 is switched to the high-temperature gear corresponding to the first number of high-temperature compensation units 131, which is the first compensation gear. For example, in FIG. 1, if first switch 1311 and second switch 1316 are on, high-temperature compensation unit 131 is connected.

Further, the first compensation gear in this embodiment is to adjust the slope of the current signal or voltage signal by controlling the number of high-temperature compensation units 131 in the temperature compensation object, that is, to adjust the size of the compensation bias current, so as to realize the switching of different compensation units.

In the first compensation gear, after a first power signal is input to the first common transistor through the first power supply in each high-temperature compensation unit 131, the drain of first transistor 1312 has a first current value proportional to the current value corresponding to the first power signal. After the second power supply inputs a second power supply signal to the second common transistor, the drain of fourth transistor has a second current value proportional to the current value corresponding to the second power supply signal.

Acquiring a first current difference between the first current value and the second current value when the first current value is greater than the second current value, and determining a first difference signal output from the drain of first transistor 1312 through the source and drain of second transistor 1313 according to the first current difference.

The first current value is the value of the current provided by the first power signal to first transistor 1312. The second current value is the value of the current provided by the second power signal to fourth transistor 1315. The first current difference is the current difference between the first current value and the second current value when the first current value is greater than the second current value. The first difference signal is a signal containing a first current difference, and the first difference signal may be a current signal or a voltage signal obtained by converting the first current difference.

Specifically, after gain compensation device 13 is switched to the first compensation gear corresponding to the first number of high-temperature compensation units 131, at the first compensation gear, each high-temperature compensation unit 131 includes a first power supply signal input by the first power supply and a second power supply signal input by the second power supply. When the first current value corresponding to the first power supply signal is greater than the second current value corresponding to the second power supply signal, acquiring a first current difference between the first current value and the second current value. A first difference signal output from the drain of first transistor 1312 through the source and drain of second transistor 1313 is determined according to the first current difference.

Understandably, each high-temperature compensation unit 131 is independent of each other. Whether each high-temperature compensation unit 131 is in a working state is adjusted by controlling the conducting of first switch 1311 and second switch 1316 between each high-temperature compensation unit 131. Among all high-temperature compensation units 131, first switch 1311 and second switch 1316 of high-temperature compensation units 131 that are not selected as temperature compensation objects are in the off-state, so that the unselected high-temperature compensation units 131 are not switched to the working state.

In a specific embodiment, the first power supply and second power supply adjust the output current value according to the current environmental temperature. That is, in this embodiment, if it is determined that the temperature compensation object is high-temperature compensation unit 131 (i.e., it is currently at a high ambient temperature), the first current value output by the first power supply is greater than the second current value output by the second power supply. If the first current value output by the first power supply is smaller than the second current value output by the second power supply, high-temperature compensation unit 131 in the temperature compensation object would not output the first difference signal.

Generating the compensation bias current for compensating the first gain deviation according to all the first difference signals.

Specifically, after each high-temperature compensation unit 131 in the temperature compensation object outputs the first difference signal, all the first difference signals are superimposed to generate a compensation bias current for compensating the first gain deviation.

In this embodiment, high-temperature compensation unit 131 performs power compensation on the first compensation signal to improve the gain. By controlling different numbers of high-temperature compensation units 131 to be connected to the circuit in working state, the slope of the power supply signal is adjusted, the switching of different high-temperature compensation gears in the device can be realized, and the flexibility and feasibility of gain compensation device 13 can be improved.

In an embodiment, after the step of generating the compensation bias current for compensating the first gain deviation according to all the first difference signals, further includes:

acquiring a second actual gain of power amplifier 122 after compensating the first gain deviation, and when a second gain deviation between the second actual gain and the preset gain is larger than a preset deviation range, adjusting the first compensation gear to a second compensation gear according to the second gain deviation; the temperature compensation object corresponding to the second compensation gear includes a third number of high-temperature compensation units 131.

Wherein, after generating the compensation bias current through all the first difference signals and compensating the first gain deviation according to the compensation bias current, the second actual gain in the embodiment is the gain of power amplifier 122. The preset deviation range is the range where gain deviation is allowed between the second actual gain and the preset gain, and the preset deviation range may be less than 0.5%-1% of the preset gain. The second compensation gear may also be different types of gears that can provide different gain compensations, and the second compensation gear in this embodiment is determined according to the number of high-temperature compensation units 131. The third number is the number of high-temperature compensation units 131 corresponding to the second compensation gear.

Specifically, after generating the compensation bias current for compensating the first gain deviation according to all the first difference signals, acquiring the second actual gain of power amplifier 122 after compensating the first gain deviation; comparing the second actual gain with the preset gain, if the second gain deviation between the second actual gain and the preset gain is larger than the preset deviation range, it indicates that the compensation bias current generated by the first number of high-temperature compensation units 131 is too small or too large, so that the second gain deviation is larger than the preset deviation threshold.

Further, when the second gain deviation does not reach the preset deviation range, the first compensation gear would be adjusted to the second compensation gear according to the second gain deviation, and the temperature compensation object corresponding to the second compensation gear include a third number of high-temperature compensation units 131, and the third number is greater than the first number of high-temperature compensation units 131 in the temperature compensation object corresponding to the first compensation gear.

Further, when the second gain deviation exceeds the preset deviation range, the first compensation gear would be adjusted to the second compensation gear according to the second gain deviation, and the temperature compensation object corresponding to the second compensation gear include a third number of high-temperature compensation units 131, and the third number is smaller than the first number of high-temperature compensation units 131 in the temperature compensation object corresponding to the first compensation gear.

Generating a new compensation bias current for compensating the second gain deviation through the temperature compensation object corresponding to the second compensation gear.

Specifically, after the first compensation gear is switched to the second compensation gear, a new compensation bias current for compensating the second gain deviation is generated through the third number of high-temperature compensation units 131 in the temperature compensation object corresponding to the second compensation gear.

In an embodiment, as shown in FIG. 1, low-temperature compensation unit 132 includes a third switch 1321, a fourth switch 1326, a fifth transistor 1322, a sixth transistor 1323, a seventh transistor 1324 and an eighth transistor 1325; the gate of first common transistor 133 is connected to a first end of third switch 1321, and a second end of third switch 1321 is connected to the gate of fifth transistor 1322; the drain of fifth transistor 1322 is connected to the source of sixth transistor 1323; the drain of sixth transistor 1323 is connected to the source of seventh transistor 1324 and the drain of eighth transistor 1325; the gate of second common transistor 134 is connected to a first end of fourth switch 1326; the gate of eighth transistor 1325 is connected to a second end of fourth switch 1326; the source of eighth transistor 1325 is connected to a ground.

In this embodiment, fifth transistor 1322 and sixth transistor 1323 are both PMOS transistors. Seventh transistor 1324 and eighth transistor 1325 are both NMOS transistors. And each transistor includes a drain, a gate and a source. Third switch 1321 and fourth switch 1326 may be contact switches, that is, when the first contact and the second contact of the switch are in contact, the switch is in an on-state; when the first contact and the second contact of the switch are not in contact, the switch is in an off-state. Or, third switch 1321 and fourth switch 1326 may also be switch transistors composed of MOS transistors.

The step of generating a compensation bias current for compensating the first gain deviation through a temperature compensation object corresponding to the first compensation gear further includes:

if the temperature compensation object corresponding to the first compensation gear includes a second number of low-temperature compensation units 132, controlling the second number of low-temperature compensation units 132 in the temperature compensation object to a connection state, so as to switch gain compensation device 13 to the first compensation gear corresponding to the second number of high-temperature compensation units 132.

The second number is the number of low-temperature compensation units 132 corresponding to the first compensation gear. Both the third power supply signal and the fourth power supply signal may be current signals or voltage signals.

Specifically, after determining the second number of low-temperature compensation units 132 included in the temperature compensation object, all low-temperature compensation units 132 in the temperature compensation object are controlled to switch to a connection state, that is, the circuit part characterizing low-temperature compensation unit 132 is in a working state. Further, according to the second number of low-temperature compensation units 132 included in the temperature compensation object, gain compensation device 13 is switched to the first compensation gear corresponding to the second number of low-temperature compensation units 132.

Further, the first compensation gear in this embodiment is to adjust the slope of the current signal or voltage signal by controlling the number of low-temperature compensation units 132 in the temperature compensation object, that is, to adjust the size of the compensation bias current, so as to realize the switching of different compensation units.

In the first compensation gear, after a third power signal is input to the first common transistor through the first power supply in each low-temperature compensation unit 132, the drain of fifth transistor 1322 has a third current value proportional to the current value corresponding to the third power signal. After the second power supply inputs a fourth power supply signal to the second common transistor, the drain of eight transistor has a fourth current value proportional to the current value corresponding to the fourth power supply signal.

Acquiring a second current difference between the third current value and the fourth current value when the third current value is smaller than the fourth current value, and determining a second difference signal output from the drain of sixth transistor 1323 after passing through the source and drain of seventh transistor 1324 according to the second current difference.

The third current value is the value of the current provided by the first power signal to first transistor 1322. The fourth current value is the value of the current provided by the second power signal to eight transistor 1325. The second current difference is the current difference between the third current value and the fourth current value when the third current value is greater than the fourth current value. The second difference signal is a signal containing a second current difference, and the second difference signal may be a current signal or a voltage signal obtained by converting the second current difference.

Specifically, after gain compensation device 13 is switched to the first compensation gear corresponding to the second number of low-temperature compensation units 132, at the first compensation gear, each low-temperature compensation unit 132 includes a third power supply signal input by the first power supply and a fourth power supply signal input by the second power supply. When the third current value corresponding to the third power supply signal is smaller than the fourth current value corresponding to the fourth power supply signal, acquiring a second current difference between the third current value and the fourth current value. A second difference signal output from the drain of sixth transistor 1312 through the source and drain of seventh transistor 1324 is determined according to the second current difference.

Understandably, each low-temperature compensation unit 132 is independent of each other. Whether each low-temperature compensation unit 132 is in a working state is adjusted by controlling the conducting of third switch 1321 and four switch 1326 between each low-temperature compensation unit 132. Among all low-temperature compensation units 132, third switch 1321 and four switch 1326 of low-temperature compensation units 132 that are not selected as temperature compensation objects are in the off-state, so that the unselected low-temperature compensation units 132 are not switched to the working state.

In a specific embodiment, the first power supply and second power supply adjust the output current value according to the current environmental temperature. That is, in this embodiment, if it is determined that the temperature compensation object is low-temperature compensation unit 132 (i.e., it is currently at a low ambient temperature), the third current value output by the first power supply is smaller than the fourth current value output by the second power supply. If the third current value output by the first power supply is greater than the fourth current value output by the second power supply, it indicates that it is currently not at a low ambient temperature, and the low-temperature compensation unit 132 in the temperature compensation object would not output the second difference signal.

Generating the compensation bias current for compensating the first gain deviation according to all the second difference signals.

Specifically, after each low-temperature compensation unit 132 in the temperature compensation object outputs the second difference signal, all the second difference signals are superimposed to generate a compensation bias current for compensating the first gain deviation.

In this embodiment, low-temperature compensation unit 132 performs power compensation on the first compensation signal to reduce the gain. By controlling different numbers of low-temperature compensation units 132 to be connected to the circuit in working state, the slope of the power supply signal is adjusted, the switching of different low-temperature compensation gears in the device can be realized, and the flexibility and feasibility of gain compensation device 13 can be improved.

In an embodiment, after the step of generating the compensation bias current for compensating the first gain deviation according to all the second difference signals, further includes:

acquiring a second actual gain of power amplifier 122 after compensating the first gain deviation, and when a second gain deviation between the second actual gain and the preset gain is larger than a preset deviation range, adjusting the first compensation gear to a second compensation gear according to the second gain deviation; the temperature compensation object corresponding to the second compensation gear includes a fourth number of low-temperature compensation units 132.

Wherein, after generating the compensation bias current through all the second difference signals and compensating the first gain deviation according to the compensation bias current, the second actual gain in the embodiment is the gain of power amplifier 122. The second compensation gear in this embodiment is determined according to the number of low-temperature compensation units 132. The fourth number is the number of low-temperature compensation units 132 corresponding to the second compensation gear.

Specifically, after generating the compensation bias current for compensating the first gain deviation according to all the second difference signals, acquiring the second actual gain of power amplifier 122 after compensating the first gain deviation; comparing the second actual gain with the preset deviation, if the second gain deviation between the second actual gain and the preset gain is larger than the preset deviation range, it indicates that the compensation bias current generated by the second number of low-temperature compensation units 132 is too small or too large, so that the second gain deviation is larger than the preset deviation threshold.

Further, when the second gain deviation does not reach the preset deviation range, the first compensation gear would be adjusted to the second compensation gear according to the second gain deviation, and the temperature compensation object corresponding to the second compensation gear include a fourth number of low-temperature compensation units 132, and the fourth number is greater than the second number of low-temperature compensation units 132 in the temperature compensation object corresponding to the first compensation gear.

Further, when the second gain deviation exceeds the preset deviation range, the first compensation gear would be adjusted to the second compensation gear according to the second gain deviation, and the temperature compensation object corresponding to the second compensation gear include a fourth number of low-temperature compensation units 132, and the fourth number is smaller than the second number of low-temperature compensation units 132 in the temperature compensation object corresponding to the first compensation gear.

Generating a new compensation bias current for compensating the second gain deviation through the temperature compensation object corresponding to the second compensation gear.

Specifically, after the first compensation gear is switched to the second compensation gear, a new compensation bias current for compensating the second gain deviation is generated through the fourth number of low-temperature compensation units 132 in the temperature compensation object corresponding to the second compensation gear.

Figure 2:
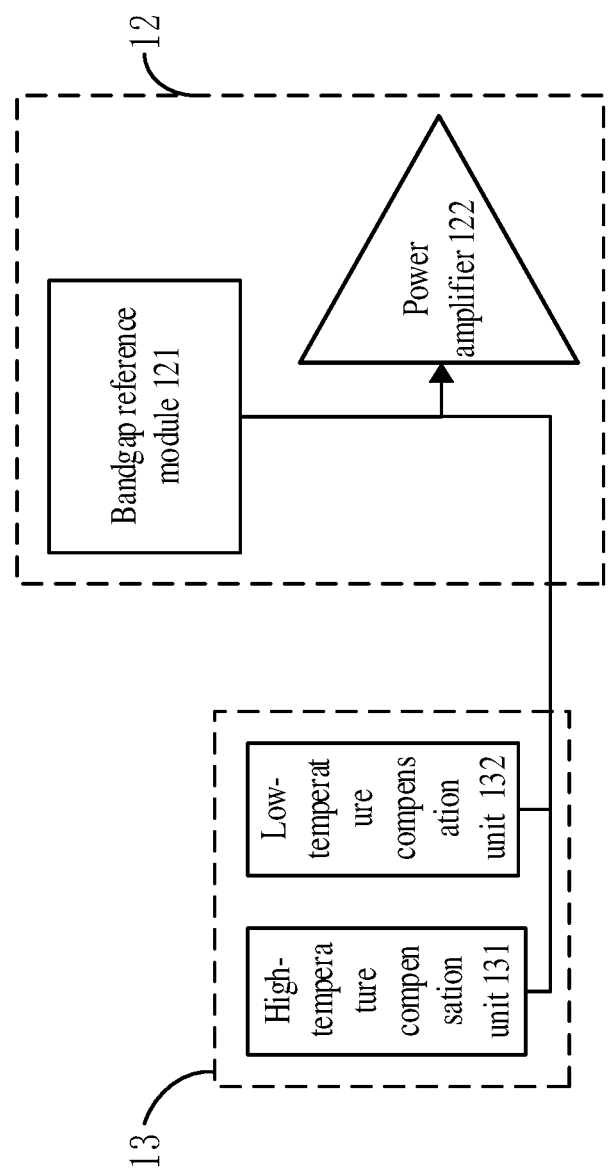
FIG. 2 is a functional block diagram of a bias circuit device according to an embodiment of the present application.

In an embodiment, as shown in FIG. 2, a bias circuit device is provided, which includes a gain compensation device 13 and a power amplification device 12, wherein the gain compensation device 13 includes at least one high-temperature compensation unit 131 and at least one low-temperature compensation unit 132; the power amplification device 12 includes a bandgap reference module 121 and a power amplifier 122. output ends of bandgap reference module 121, high-temperature compensation unit 131 and low-temperature compensation unit 132 are all connected with power amplifier 122.

Wherein, power amplification device 12 includes a bandgap reference module 121 and a power amplifier 122, and power amplification device 12 is used for power amplification of input power signals. Optionally, power amplification device 12 may also include an RC circuit module for filtering bias currents. Gain compensation device 13 is used to adjust the bias current input to power amplification device 12, and includes at least one high-temperature compensation unit 131 and at least one low-temperature compensation unit 132. High-temperature compensation unit 131 is a unit for compensating the gain of power amplifier 122 in a high temperature environment. Low-temperature compensation unit 132 is a unit for compensating the gain of power amplifier 122 in a low temperature environment. Bandgap reference module 121 is used to provide initial bias current to power amplifier 122. Bandgap reference module 121 includes a core bandgap circuit, bias feedback compensation circuit and reference startup circuit.

Power amplifier 122 acquires an initial bias current output from the output end of bandgap reference module 121, and performs power amplification on the initial bias current to obtain an actual gain.

Wherein, the initial bias current is the initial power signal provided by bandgap reference module 121 to power amplifier 122. Power amplifier 122 performs power amplification on the initial bias current to obtain an output current, and the ratio of the output current to the initial bias current is the actual gain.

Specifically, output end of bandgap reference module 121 outputs an initial bias current to power amplifier 122, and power amplifier 122 performs power amplification on the initial bias current to obtain the actual gain. Optionally, an RC circuit module may be connected between bandcap reference module 121 and power amplifier 122, the output end of bandcap reference module 121 outputs an initial bias current to the input end of the RC circuit module. And the RC circuit module filters the initial bias current, and then outputs the filtered initial bias current to power amplifier 122 through the output end of the RC circuit module. Bandgap reference module 121 uses the sum of a voltage with a positive temperature coefficient and a voltage with a negative temperature coefficient to counteract the two temperature coefficients, and achieves a temperature-independent voltage reference, so that bandgap reference module 121 outputs an initial bias current independent of temperature.

Gain compensation device 13 is configured for receiving a compensation signal containing a first gain deviation, determining a first compensation gear according to the first gain deviation, and generating a compensation bias current for compensating the first gain deviation through a temperature compensation object corresponding to the first compensation gear; each first compensation gear corresponds to a group of temperature compensation objects, and the temperature compensation object include at least one high-temperature compensation unit 131 or at least one low-temperature compensation unit 132; the first gain deviation represents a gain deviation between a first actual gain output by a power amplifier 122 and a preset gain, and the gain deviation is caused by the ambient temperature of power amplifier 122.

The first gain deviation is in fact the gain deviation between a first actual gain output by power amplifier 122 and the preset gain, and the gain deviation is caused by the ambient temperature of power amplifier 122. The compensation signal is a signal containing a first gain deviation. The first compensation gear may also be different types of gears that can provide different gain compensations, and the first compensation gear is determined according to the number of high-temperature compensation units 131 or the number of low-temperature compensation units 132. The temperature compensation objects are gain compensation units corresponding to different ambient temperatures of power amplifier 122. Understandably, the temperature compensation object can be either high-temperature compensation unit 131 or low-temperature compensation unit 132. The preset gain is the expected gain after power amplifier 122 performs power amplification on the input power signal.

Specifically, at any ambient temperature, firstly, the input power signal input to power amplifier 122 is obtained, and at the same time, the output power signal output by power amplifier 122 is obtained, and then the first actual gain is determined according to the ratio of the output power signal to the input power signal. Then determining a first gain deviation according to the difference between the first actual gain and the preset gain. Wherein, the input power signal is the power signal initially input to the input of power amplifier 122, the output power signal is obtained by amplifying the input power signal with power amplifier 122.

Understandably, the first gain deviation is related to the current environmental temperature of power amplifier, that is, the ambient temperature of power amplifier has a correlation relationship with the first gain deviation. Therefore, the first gain deviation represents the gain deviation between the first actual gain output by power amplifier 122 and the preset gain, and the gain deviation is caused by the ambient temperature of power amplifier 122.

Understandably, the correlation between the first gain deviation and the ambient temperature of power amplifier can be measured in advance. The correlations between all the first gain deviations requiring gain compensation and the ambient temperatures of power amplifier can be stored in a deviation table in the database. Therefore, when it is detected that the current environmental temperature matches an environmental temperature in the deviation table, it can be confirmed that gain compensation is required currently. In this case, a compensation signal corresponding to the current environmental temperature is generated, and the compensation signal contains a first gain deviation associated with the current environmental temperature.

Optionally, in another embodiment, a signal transmission unit can be connected between power amplifier 122 and gain compensation device 13. When gain compensation device 13 is connected to power amplifier 122, the first gain deviation corresponding to the current environmental temperature can be transmitted to gain compensation device 13 in the form of a compensation signal by the signal transmission unit.

Further, after gain compensation device 13 receives the compensation signal including the first gain deviation, the temperature compensation object and the specific number of high-temperature compensation units 131 or low-temperature compensation units 132 in the temperature compensation object are determined according to the first gain deviation. A first compensation gear is determined according to the specific number of high-temperature compensation units 131 or low-temperature compensation unit 132 in the temperature compensation object. A compensation bias current is generated by the temperature compensation object corresponding to the first compensation gear, and the compensation bias current is used for compensating the first gain deviation, so that the first actual gain is close to or even equal to the preset gain.

Power amplifier 122 receives the compensation bias current and the initial bias current of superimposed inputs, and compensates the first gain deviation according to the compensation bias current and the initial bias current of superimposed inputs.

Specifically, after the output end of bandgap reference module 121 outputs the initial bias current and the output end of gain compensation device 13 outputs the compensation bias current, the current obtained by superimposing the initial bias current and the compensation bias current is input into power amplifier 122 to compensate the first gain deviation, so that the actual gain is close to or even equal to the preset gain.

In this embodiment, based on an initial bias current provided by a bandgap reference, gain compensation device 13 is added to generate a compensation bias current, and the initial bias current and compensation bias current are superimposed, so that the gain of power amplifier 122 is further compensated along with the changes of temperature, which improves the stability of power amplifier 122.

In an embodiment, the step of receiving a compensation signal containing a first gain deviation, determining a first compensation gear according to the first gain deviation includes:

if the first gain deviation is a first deviation, determining that the temperature compensation object only includes high-temperature compensation unit 131; the first deviation is a negative gain deviation when the first actual gain is less than the preset gain; and determining the number of high-temperature compensation units 131 in the temperature compensation object according to the deviation value of the first deviation, and determining a first compensation gear according to the number of high-temperature compensation units 131. The first deviation refers to the negative gain deviation between the actual gain and the preset gain when the actual gain is smaller than the preset gain.

Specifically, after receiving a compensation signal containing a first gain deviation, comparing the sizes of the first actual gain and the preset gain that the first gain deviation represents; if the first actual gain is smaller than the preset gain ((i.e., the gain deviation between the actual gain and the preset gain is negative gain deviation), it means that the ambient temperature is high. When power amplifier 122 performs power amplification on the input power signal, it is affected by the high ambient temperature, and the ratio between the output power signal and the input power signal is smaller than the preset gain. Therefore, when the first gain deviation is the first deviation, it is determined that the temperature compensation object is high-temperature compensation unit 131. Understandably, in a high temperature environment, the gain of power amplifier 122 would decrease.

Further, after determining that the temperature compensation object is high-temperature compensation unit 131, the specific number of high-temperature compensation units 131 in the temperature compensation object is determined according to the deviation value of the first deviation (i. e., the number of high-temperature compensation units 131 switched to on-state), and the first compensation gear is determined according to the specific number of high-temperature compensation units 131. For example, if the deviation value of the first deviation is 30% (i. e., the actual gain is 30% lower than the preset gain), three high-temperature compensation units 131 may be selected as temperature compensation objects, that is, three high-temperature compensation units 131 may be switched to working state.

In an embodiment, the step of receiving a compensation signal containing a first gain deviation, determining a compensation gear according to the first gain deviation includes:

If the first gain deviation is second deviation, it is determined that only the low-temperature compensation unit 132 is included in the temperature compensation object. The second deviation is a positive gain deviation when the actual gain is greater than the preset gain; according to the deviation value of the second deviation, the number of low-temperature compensation units 132 in the temperature compensation object is determined, and according to the number of the low-temperature compensation units 132, the first compensation gear is determined. The second deviation refers to the positive gain deviation between the actual gain and the preset gain when the actual gain is greater than the preset gain.

Specifically, after receiving a compensation signal containing a first gain deviation, comparing the sizes of the actual gain and the preset gain that the first gain deviation represents; if the actual gain is greater than the preset gain ((i.e., the gain deviation between the actual gain and the preset gain is positive gain deviation), it means that the ambient temperature is low. When power amplifier 122 performs power amplification on the input power signal, it is affected by the low ambient temperature, and the ratio between the output power signal and the input power signal is greater than the preset gain. Therefore, when the first gain deviation is the second deviation, it is determined that the temperature compensation object is low-temperature compensation unit 132. Understandably, in a low temperature environment, the gain of power amplifier 122 would increase.

Further, after determining that the temperature compensation object is low-temperature compensation unit 132, the specific number of low-temperature compensation units 132 in the temperature compensation object is determined according to the deviation value of the second deviation (i. e., the number of low-temperature compensation units 132 switched to on-state), and the first compensation gear is determined according to the specific number of low-temperature compensation units 132. For example, if the deviation value of the second deviation is 20% (i. e., the actual gain is 20% higher than the preset gain), two low-temperature compensation units 132 may be selected as temperature compensation objects, that is, two low-temperature compensation units 132 may be switched to working state.

In an embodiment, as shown in FIG. 1, gain compensation device 13 further includes a first power supply, a second power supply, a first common transistor 133 and a second common transistor 134; high-temperature compensation unit 131 includes first switch 1311, second switch 1316, first transistor 1312, second transistor 1313, third transistor 1314 and fourth transistor 1315; the first power supply is connected to the drain of first common transistor 133; the gate of first common transistor 133 is connected to a first end of first switch 1311, and a second end of first switch 1311 is connected to the gate of first transistor 1312; the drain of first transistor 1312 is connected to the source of second transistor 1313 and the drain of third transistor 1314; the source of third transistor 1314 is connected to the drain of fourth transistor 1315; the second power supply is connected to the drain of second common transistor 134; the gate of second common transistor 134 is connected to a first end of second switch 1316; the gate of fourth transistor 1315 is connected to a second end of second switch 1316; the source of fourth transistor 1315 is connected to a ground; the first power supply and second power supply have different temperature coefficients.

The first power supply and second power supply can both be current sources or voltage sources, and their temperature coefficients are different. For example, the first power supply may be a PTAT current source, that is, the first power supply may be a current source with a positive temperature coefficient. The second power supply may be a NTAT/ZTAT/CTAT current source, that is, the second power supply may be a current source with a negative temperature coefficient or a current source with a zero temperature coefficient. In this embodiment, first common transistor 133, first transistor 1312 and second transistor 1313 are all PMOS transistors. Second common transistor 134, third transistor 1314 and fourth transistor 1315 are all NMOS transistors, and each transistor includes a drain, gate and source. First switch 1311 and second switch 1316 may be contact switches, that is, when the first contact contacts the second contact of the switch, the switch is in an on-state; when the first contact does not contacts the second contact, the switch is in an off-state. Or, first switch 1311 and second switch 1316 may also be switch transistors composed of MOS transistors. The ground is the ground in the circuit. Understandably, the source of fourth transistor 1315 may also be connected to other low-level ports.

The step of generating a compensation bias current for compensating the first gain deviation through a temperature compensation object corresponding to the first compensation gear includes:

if the temperature compensation object corresponding to the first compensation gear includes a first number of high-temperature compensation units 131, controlling the first number of high-temperature compensation units 131 in the temperature compensation object to an on-state, so as to switch gain compensation device 13 to the first compensation gear corresponding to the first number of high-temperature compensation units 131.

And, the connection state is a state in which the drain and the source of the transistor are connected to each other. The on-state is the state when the first contact and second contact of the switch are in contact. Both the first power supply signal and the second power supply signal may be current signals or voltage signals. The first number is the number of high-temperature compensation units 131 corresponding to the first compensation gear.

Specifically, after determining the first number of high-temperature compensation units 131 included in the temperature compensation object, all high-temperature compensation units 131 in the temperature compensation object are controlled to switch to a connection state, that is, the circuit part characterizing high-temperature compensation unit 131 is in a working state. Further, according to the first number of high-temperature compensation units 131 included in the temperature compensation object, gain compensation device 13 is switched to the high-temperature gear corresponding to the first number of high-temperature compensation units 131, which is the first compensation gear. For example, in FIG. 1, if first switch 1311 and second switch 1316 are on, high-temperature compensation unit 131 is connected.

Further, the first compensation gear in this embodiment is to adjust the slope of the current signal or voltage signal by controlling the number of high-temperature compensation units 131 in the temperature compensation object, that is, to adjust the size of the compensation bias current, so as to realize the switching of different compensation units.

In the first compensation gear, after a first power signal is input to the first common transistor through the first power supply in each high-temperature compensation unit 131, the drain of first transistor 1312 has a first current value proportional to the current value corresponding to the first power signal. After the second power supply inputs a second power supply signal to the second common transistor, the drain of fourth transistor has a second current value proportional to the current value corresponding to the second power supply signal.

Acquiring a first current difference between the first current value and the second current value when the first current value is greater than the second current value, and determining a first difference signal output from the drain of first transistor 1312 through the source and drain of second transistor 1313 according to the first current difference. The first current value is the value of the current provided by the first power signal to first transistor 1312. The second current value is the value of the current provided by the second power signal to fourth transistor 1315. The first current difference is the current difference between the first current value and the second current value when the first current value is greater than the second current value. The first difference signal is a signal containing a first current difference, and the first difference signal may be a current signal or a voltage signal obtained by converting the first current difference.

Specifically, after gain compensation device 13 is switched to the first compensation gear corresponding to the first number of high-temperature compensation units 131, at the first compensation gear, each high-temperature compensation unit 131 includes a first power supply signal input by the first power supply and a second power supply signal input by the second power supply. When the first current value corresponding to the first power supply signal is greater than the second current value corresponding to the second power supply signal, acquiring a first current difference between the first current value and the second current value. A first difference signal output from the drain of first transistor 1312 through the source and drain of second transistor 1313 is determined according to the first current difference.

Understandably, each high-temperature compensation unit 131 is independent of each other. Whether each high-temperature compensation unit 131 is in a working state is determined by controlling the conducting of first switch 1311 and second switch 1316 between each high-temperature compensation unit 131. Among all high-temperature compensation units 131, first switch 1311 and second switch 1316 of high-temperature compensation units 131 that are not selected as temperature compensation objects are in the off-state, so that the unselected high-temperature compensation units 131 are not switched to the working state.

In a specific embodiment, the first power supply and second power supply adjust the output current value according to the current environmental temperature. That is, in this embodiment, if it is determined that the temperature compensation object is high-temperature compensation unit 131 (i.e., it is currently at a high ambient temperature), the first current value output by the first power supply is greater than the second current value output by the second power supply. If the first current value output by the first power supply is smaller than the second current value output by the second power supply, it indicates that it is currently not at a high ambient temperature, and the high-temperature compensation unit 131 in the temperature compensation object would not output the first difference signal.

Generating the compensation bias current for compensating the first gain deviation according to all the first difference signals. Specifically, after each high-temperature compensation unit 131 in the temperature compensation object outputs the first difference signal, all the first difference signals are superimposed to generate a compensation bias current for compensating the first gain deviation.

In another specific embodiment, after the step of generating the compensation bias current for compensating the first gain deviation according to all the first difference signals, further includes:

acquiring a second actual gain of power amplifier 122 after compensating the first gain deviation, and when a second gain deviation between the second actual gain and the preset gain is larger than a preset deviation range, adjusting the first compensation gear to a second compensation gear according to the second gain deviation; the temperature compensation object corresponding to the second compensation gear includes a third number of high-temperature compensation units 131.

Wherein, after generating the compensation bias current through all the first difference signals and compensating the first gain deviation according to the compensation bias current, the second actual gain in the embodiment is the gain of power amplifier 122. The preset deviation range is the range where gain deviation is allowed between the second actual gain and the preset gain, and the preset deviation range may be less than 0.5%-1% of the preset gain. The second compensation gear may also be different types of gears that can provide different gain compensations, and the second compensation gear in this embodiment is determined according to the number of high-temperature compensation units 131. The third number is the number of high-temperature compensation units 131 among all high-temperature compensation units 131 determined to correspond to the second compensation gear.

Specifically, after generating the compensation bias current for compensating the first gain deviation according to all the first difference signals, acquiring the second actual gain of power amplifier 122 after compensating the first gain deviation; comparing the second actual gain with the preset gain, if the second gain deviation between the second actual gain and the preset gain is larger than the preset deviation range, it indicates that the compensation bias current generated by the first number of high-temperature compensation units 131 is too small or too large, so that the second gain deviation is larger than the preset deviation threshold.

Further, when the second gain deviation does not reach the preset deviation range, the first compensation gear would be adjusted to the second compensation gear according to the second gain deviation, and the temperature compensation object corresponding to the second compensation gear include a third number of high-temperature compensation units 131, and the third number is greater than the first number of high-temperature compensation units 131 in the temperature compensation object corresponding to the first compensation gear. Further, when the second gain deviation exceeds the preset deviation range, the first compensation gear would be adjusted to the second compensation gear according to the second gain deviation, and the temperature compensation object corresponding to the second compensation gear include a third number of high-temperature compensation units 131, and the third number is smaller than the first number of high-temperature compensation units 131 in the temperature compensation object corresponding to the first compensation gear.

Generating a new compensation bias current for compensating the second gain deviation through the temperature compensation object corresponding to the second compensation gear. Specifically, after the first compensation gear is switched to the second compensation gear, a new compensation bias current for compensating the second gain deviation is generated through the third number of high-temperature compensation units 131 in the temperature compensation object corresponding to the second compensation gear.

In another specific embodiment, as shown in FIG. 1, low-temperature compensation unit 132 includes a third switch 1321, a fourth switch 1326, a fifth transistor 1322, a sixth transistor 1323, a seventh transistor 1324 and an eighth transistor 1325; the gate of first common transistor 133 is connected to a first end of third switch 1321, and a second end of third switch 1321 is connected to the gate of fifth transistor 1322; the drain of fifth transistor 1322 is connected to the source of sixth transistor 1323; the drain of sixth transistor 1323 is connected to the source of seventh transistor 1324 and the drain of eighth transistor 1325; the anode of the second power supply is connected to the drain of seventh transistor 1324; the gate of second common transistor 134 is connected to a first end of fourth switch 1326; the gate of eighth transistor 1325 is connected to a second end of fourth switch 1326; the source of eighth transistor 1325 is connected to a ground.

In this embodiment, fifth transistor 1322 and sixth transistor 1323 are both PMOS transistors. Seventh transistor 1324 and eighth transistor 1325 are both NMOS transistors. And each transistor includes a drain, a gate and a source. Third switch 1321 and fourth switch 1326 may be contact switches, that is, when the first contact and the second contact of the switch are in contact, the switch is in an on-state; when the first contact and the second contact of the switch are not in contact, the switch is in an off-state. Or, third switch 1321 and fourth switch 1326 may also be switch transistors composed of MOS transistors.

The step of generating a compensation bias current for compensating the first gain deviation through a temperature compensation object corresponding to the first compensation gear further includes:

if the temperature compensation object corresponding to the first compensation gear includes a second number of low-temperature compensation units 132, controlling the second number of low-temperature compensation units 132 in the temperature compensation object to a connection state, so as to switch gain compensation device 13 to the first compensation gear corresponding to the second number of low-temperature compensation units 132.

The second number is the number of low-temperature compensation units 132 corresponding to the first compensation gear. Both the third power supply signal and the fourth power supply signal may be current signals or voltage signals.

Specifically, after determining the second number of low-temperature compensation units 132 included in the temperature compensation object, all low-temperature compensation units 132 in the temperature compensation object are controlled to switch to a connection state, that is, the circuit part characterizing low-temperature compensation unit 132 is in a working state. Further, according to the second number of low-temperature compensation units 132 included in the temperature compensation object, gain compensation device 13 is switched to the first compensation gear corresponding to the second number of low-temperature compensation units 132.

Further, the first compensation gear in this embodiment is to adjust the slope of the current signal or voltage signal by controlling the number of low-temperature compensation units 132 in the temperature compensation object, that is, to adjust the size of the compensation bias current, so as to realize the switching of different compensation units.

In the first compensation gear, after a third power signal is input to the first common transistor through the first power supply in each low-temperature compensation unit 132, the drain of fifth transistor 1322 has a third current value proportional to the current value corresponding to the third power signal. After the second power supply inputs a fourth power supply signal to the second common transistor, the drain of eight transistor has a fourth current value proportional to the current value corresponding to the fourth power supply signal.

Acquiring a second current difference between the third current value and the fourth current value when the third current value is smaller than the fourth current value, and determining a second difference signal output from the drain of sixth transistor 1323 after passing through the source and drain of seventh transistor 1324 according to the second current difference.

The third current value is the value of the current provided by the first power signal to first transistor 1322. The fourth current value is the value of the current provided by the second power signal to eight transistor 1325. The second current difference is the current difference between the third current value and the fourth current value when the third current value is greater than the fourth current value. The second difference signal is a signal containing a second current difference, and the second difference signal may be a current signal or a voltage signal obtained by converting the second current difference.

Specifically, after gain compensation device 13 is switched to the first compensation gear corresponding to the second number of low-temperature compensation units 132, at the first compensation gear, each low-temperature compensation unit 132 includes a third power supply signal input by the first power supply and a fourth power supply signal input by the second power supply. When the third current value corresponding to the third power supply signal is smaller than the fourth current value corresponding to the fourth power supply signal, acquiring a second current difference between the third current value and the fourth current value. A second difference signal output from the drain of sixth transistor 1312 through the source and drain of seventh transistor 1324 is determined according to the second current difference.

Understandably, each low-temperature compensation unit 132 is independent of each other. Whether each low-temperature compensation unit 132 is in a working state is determined by controlling the conducting of third switch 1321 and fourth switch 1326 between each low-temperature compensation unit 132. Among all low-temperature compensation units 132, third switch 1321 and four switch 1326 of low-temperature compensation units 132 that are not selected as temperature compensation objects are in the off-state, so that the unselected low-temperature compensation units 132 are not switched to the working state.

In a specific embodiment, the first power supply and second power supply adjust the output current value according to the current environmental temperature. That is, in this embodiment, if it is determined that the temperature compensation object is low-temperature compensation unit 132 (i.e., it is currently at a low ambient temperature), the third current value output by the first power supply is smaller than the fourth current value output by the second power supply. If the third current value output by the first power supply is greater than the fourth current value output by the second power supply, it indicates that it is currently not at a low ambient temperature, and the low-temperature compensation unit 132 in the temperature compensation object would not output the second difference signal.

Generating the compensation bias current for compensating the first gain deviation according to all the second difference signals. Specifically, after each low-temperature compensation unit 132 in the temperature compensation object outputs the second difference signal, all the second difference signals are superimposed to generate a compensation bias current for compensating the first gain deviation.

In an embodiment, after the step of generating the compensation bias current for compensating the first gain deviation according to all the second difference signals, further includes:

acquiring a second actual gain of power amplifier 122 after compensating the first gain deviation, and when a second gain deviation between the second actual gain and the preset gain is larger than a preset deviation range, adjusting the first compensation gear to a second compensation gear according to the second gain deviation; the temperature compensation object corresponding to the second compensation gear includes a fourth number of low-temperature compensation units 132.

Wherein, after generating the compensation bias current through all the second difference signals and compensating the first gain deviation according to the compensation bias current, the second actual gain in the embodiment is the gain of power amplifier 122. The second compensation gear in this embodiment is determined according to the number of low-temperature compensation units 132. The fourth number is the number of low-temperature compensation units 132 among all low-temperature compensation units 131 determined to correspond to the second compensation gear. Specifically, after generating the compensation bias current for compensating the first gain deviation according to all the second difference signals, acquiring the second actual gain of power amplifier 122 after compensating the first gain deviation; comparing the second actual gain with the preset gain, if the second gain deviation between the second actual gain and the preset gain is larger than the preset deviation range, it indicates that the compensation bias current generated by the second number of low-temperature compensation units 132 is too small or too large, so that the second gain deviation is larger than the preset deviation threshold.

Further, when the second gain deviation does not reach the preset deviation range, the first compensation gear would be adjusted to the second compensation gear according to the second gain deviation, and the temperature compensation object corresponding to the second compensation gear include a fourth number of low-temperature compensation units 132, and the fourth number is greater than the second number of low-temperature compensation units 132 in the temperature compensation object corresponding to the first compensation gear. Further, when the second gain deviation exceeds the preset deviation range, the first compensation gear would be adjusted to the second compensation gear according to the second gain deviation, and the temperature compensation object corresponding to the second compensation gear include a fourth number of low-temperature compensation units 132, and the fourth number is smaller than the second number of low-temperature compensation units 132 in the temperature compensation object corresponding to the first compensation gear.

Generating a new compensation bias current for compensating the second gain deviation through the temperature compensation object corresponding to the second compensation gear. Specifically, after the first compensation gear is switched to the second compensation gear, a new compensation bias current for compensating the second gain deviation is generated through the fourth number of low-temperature compensation units 132 in the temperature compensation object corresponding to the second compensation gear.

It should be understood that the number of each step in the above embodiments is not intended to limit the execution order, and the execution order of each process should be determined by its function and internal logic, which should not bring any limitation to the implementation process of the embodiments of the present application. And, the singular terms "a", "an" and "the/said" include plural reference and vice versa unless the context clearly indicates otherwise.

It may be clearly understood by those skilled in the art that for the convenience and conciseness of description, only the divisions of the above functional units and modules were exemplified. In practical application, the above functions may be assigned to different functional units and modules as required, that is, the internal structure of the device may be divided into different functional units or modules to complete all or part of the functions described above. The above embodiments are only used to illustrate the technical solution of the present application, not intended to limit it. Although the application has been described in detail with reference to the above embodiments, those of ordinary skill in the art would understand that the technical solutions described in the above embodiments may still be modified or some of the technical features may be replaced equivalently. However, these modifications or equivalent substitutions do not deviate from the spirit or scope of the technical solutions of the embodiments of this application, and shall be included in the protection scope of this application.

What is claimed is:

1. A gain compensation device, comprising at least one high-temperature compensation unit and at least one low-temperature compensation unit;
   the gain compensation device is configured for receiving a compensation signal containing a first gain deviation, determining a first compensation gear according to the first gain deviation, and generating a compensation bias current for compensating the first gain deviation through a temperature compensation object corresponding to the first compensation gear; each first compensation gear corresponds to a group of temperature compensation objects, and the temperature compensation object comprises the at least one high-temperature compensation unit or the at least one low-temperature compensation unit; the first gain deviation represents a gain deviation between a first actual gain output by a power amplifier and a preset gain, and the gain deviation is caused by the ambient temperature of the power amplifier.

2. The gain compensation device of claim 1, wherein the determining a first compensation gear according to the first gain deviation comprises:
   if the first gain deviation is a first deviation, determining that the temperature compensation object only includes the high-temperature compensation unit; the first deviation is a negative gain deviation when the first actual gain is less than the preset gain; and
   determining the number of the high-temperature compensation units in the temperature compensation object according to the deviation value of the first deviation, and determining a first compensation gear according to the number of the high-temperature compensation units.

3. The gain compensation device of claim 1, wherein the receiving a compensation signal containing a first gain deviation, determining a first compensation gear according to the first gain deviation comprises:
   if the first gain deviation is a second deviation, determining that the temperature compensation object only includes the low-temperature compensation unit; the second deviation is a positive gain deviation when the first actual gain is greater than the preset gain; and
   determining the number of the low-temperature compensation units in the temperature compensation object according to the deviation value of the second deviation, and determining a first compensation gear according to the number of the low-temperature compensation units.

4. The gain compensation device of claim 1, wherein the gain compensation device further comprises a first power supply, a second power supply, a first common transistor and a second common transistor; the high-temperature compensation unit comprises a first switch, a second switch, a first transistor, a second transistor, a third transistor and a fourth transistor; the first power supply is connected with the drain of the first common transistor; the gate of the first common transistor is connected with an first end of the first switch, and a second end of the first switch is connected with the gate of the first transistor; the drain of the first transistor is connected with the source of the second transistor and the drain of the third transistor; the source of the third transistor is connected with the drain of the fourth transistor; the second power supply is connected with the drain of the second common transistor; the gate of the second common transistor is connected with a first end of the second switch; the gate of the fourth transistor is connected with a second end of the second switch; the source of the fourth transistor is connected with a ground; the first power supply and the second power supply have different temperature coefficients.

5. The gain compensation device of claim 4, wherein the generating a compensation bias current for compensating the first gain deviation through a temperature compensation object corresponding to the first compensation gear comprises:

if the temperature compensation object corresponding to the first compensation gear includes a first number of high-temperature compensation units, controlling the first number of high-temperature compensation units in the temperature compensation object to an on-state, to switch the gain compensation device to the first compensation gear corresponding to the first number of high-temperature compensation units.

6. The gain compensation device of claim 4, wherein after the generating a compensation bias current for compensating the first gain deviation through a temperature compensation object corresponding to the first compensation gear, further comprises:
acquiring a second actual gain of the power amplifier after compensating the first gain deviation, and when a second gain deviation between the second actual gain and the preset gain is larger than a preset deviation range, adjusting the first compensation gear to a second compensation gear according to the second gain deviation; the temperature compensation object corresponding to the second compensation gear includes a third number of high-temperature compensation units;
generating a new compensation bias current for compensating the second gain deviation through the temperature compensation object corresponding to the second compensation gear.

7. The gain compensation device of claim 4, wherein the low-temperature compensation unit comprises a third switch, a fourth switch, a fifth transistor, a sixth transistor, a seventh transistor and an eight transistor; the gate of the first common transistor is connected with an first end of the third switch, and a second end of the third switch is connected with the gate of the fifth transistor; the drain of the fifth transistor is connected with the source of the sixth transistor; the drain of the sixth transistor is connected with the source of the seventh transistor and the drain of the eighth transistor; the gate of the second common transistor is connected with a first end of the fourth switch; the gate of the eighth transistor is connected with a second end of the fourth switch; and the source of the eighth transistor is connected with the ground.

8. The gain compensation device of claim 7, wherein the generating a compensation bias current for compensating the first gain deviation through a temperature compensation object corresponding to the first compensation gear further comprises:
if the temperature compensation object corresponding to the first compensation gear includes a second number of low-temperature compensation units, controlling the second number of low-temperature compensation units in the temperature compensation object to a connection state, to switch the gain compensation device to the first compensation gear corresponding to the second number of low-temperature compensation units.

9. The gain compensation device of claim 8, wherein after the generating a compensation bias current for compensating the first gain deviation through a temperature compensation object corresponding to the first compensation gear, further comprises:
acquiring a second actual gain of the power amplifier after compensating the first gain deviation, and when a second gain deviation between the second actual gain and the preset gain is larger than a preset deviation range, adjusting the first compensation gear to a second compensation gear according to the second gain deviation; the temperature compensation object corresponding to the second compensation gear includes a four number of low-temperature compensation units;
generating a new compensation bias current for compensating the second gain deviation through the temperature compensation object corresponding to the second compensation gear.

10. A bias circuit device, comprising a gain compensation device and a power amplification device, wherein the gain compensation device comprises at least one high-temperature compensation unit and at least one low-temperature compensation unit; the power amplification device comprises a bandgap reference module and a power amplifier;
output ends of the bandgap reference module, the high-temperature compensation unit and the low-temperature compensation unit are all connected with the power amplifier;
the power amplifier acquires an initial bias current output from the output end of the bandgap reference module, and performs power amplification on the initial bias current to obtain an actual gain;
the gain compensation device is configured for receiving a compensation signal containing a first gain deviation, determining a first compensation gear according to the first gain deviation, and generating a compensation bias current for compensating the first gain deviation through a temperature compensation object corresponding to the first compensation gear; each first compensation gear corresponds to a group of temperature compensation objects, and the temperature compensation object comprises the at least one high-temperature compensation unit or the at least one low-temperature compensation unit; the first gain deviation represents a gain deviation between the actual gain output by a power amplifier and a preset gain, and the gain deviation is caused by the ambient temperature of the power amplifier;
and the power amplifier receives the compensation bias current and the initial bias current of superimposed inputs, and compensates the first gain deviation according to the compensation bias current and the initial bias current of superimposed inputs.

11. The bias circuit device of claim 10, wherein the receiving a compensation signal containing a first gain deviation, determining a first compensation gear according to the first gain deviation comprises:
if the first gain deviation is a first deviation, determining that the temperature compensation object only includes the high-temperature compensation unit; the first deviation is a negative gain deviation when the actual gain is less than the preset gain; and
determining the number of the high-temperature compensation units in the temperature compensation object according to the deviation value of the first deviation, and determining a first compensation gear according to the number of the high-temperature compensation units.

12. The bias circuit device of claim 11, wherein the receiving a compensation signal containing a first gain deviation, determining a compensation gear according to the first gain deviation comprises:
if the first gain deviation is a second deviation, determining that the temperature compensation object only includes the low-temperature compensation unit; the second deviation is a positive gain deviation when the actual gain is greater than the preset gain; and
determining the number of the low-temperature compensation units in the temperature compensation object according to the deviation value of the second deviation, and determining a first compensation gear according to the number of the low-temperature compensation units.

13. The bias circuit device of claim 11, wherein the gain compensation device further comprises a first power supply, a second power supply, a first common transistor and a second common transistor; the high-temperature compensation unit comprises a first switch, a second switch, a first transistor, a second transistor, a third transistor and a fourth transistor; the first power supply is connected with the drain of the first common transistor; the gate of the first common transistor is connected with an first end of the first switch, and a second end of the first switch is connected with the gate of the first transistor; the drain of the first transistor is connected with the source of the second transistor and the drain of the third transistor; the source of the third transistor is connected with the drain of the fourth transistor; the second power supply is connected with the drain of the second common transistor; the gate of the second common transistor is connected with a first end of the second switch; the gate of the fourth transistor is connected with a second end of the second switch; the source of the fourth transistor is connected with a ground; the first power supply and the second power supply have different temperature coefficients.

14. The bias circuit device of claim 11, wherein the generating a compensation bias current for compensating the first gain deviation through a temperature compensation object corresponding to the first compensation gear further comprises:
if the temperature compensation object corresponding to the first compensation gear includes a first number of high-temperature compensation units, controlling the first number of high-temperature compensation units in the temperature compensation object to an on-state, to switch the gain compensation device to the first compensation gear corresponding to the first number of high-temperature compensation units.

15. The bias circuit device of claim 11, wherein after the generating a compensation bias current for compensating the first gain deviation through a temperature compensation object corresponding to the first compensation gear, further comprises:
acquiring a second actual gain of the power amplifier after compensating the first gain deviation, and when a second gain deviation between the second actual gain and the preset gain is larger than a preset deviation range, adjusting the first compensation gear to a second compensation gear according to the second gain deviation; the temperature compensation object corresponding to the second compensation gear includes a third number of high-temperature compensation units;
generating a new compensation bias current for compensating the second gain deviation through the temperature compensation object corresponding to the second compensation gear.

16. The bias circuit device of claim 13, wherein the low-temperature compensation unit comprises a third switch, a fourth switch, a fifth transistor, a sixth transistor, a seventh transistor and an eight transistor; the gate of the first common transistor is connected with an first end of the third switch, and a second end of the third switch is connected with the gate of the fifth transistor; the drain of the fifth transistor is connected with the source of the sixth transistor; the drain of the sixth transistor is connected with the source of the seventh transistor and the drain of the eighth transistor; the gate of the second common transistor is connected with a first end of the fourth switch; the gate of the eighth transistor is connected with a second end of the fourth switch; and the source of the eighth transistor is connected with the ground.

17. The bias circuit device of claim 16, wherein the generating a compensation bias current for compensating the first gain deviation through a temperature compensation object corresponding to the first compensation gear further comprises:
if the temperature compensation object corresponding to the first compensation gear includes a second number of low-temperature compensation units, controlling the second number of low-temperature compensation units in the temperature compensation object to a connection state, to switch the gain compensation device to the first compensation gear corresponding to the second number of low-temperature compensation units.

18. The bias circuit device of claim 16, wherein after the generating a compensation bias current for compensating the first gain deviation through a temperature compensation object corresponding to the first compensation gear, further comprises:
acquiring a second actual gain of the power amplifier after compensating the first gain deviation, and when a second gain deviation between the second actual gain and the preset gain is larger than a preset deviation range, adjusting the first compensation gear to a second compensation gear according to the second gain deviation; the temperature compensation object corresponding to the second compensation gear includes a four number of low-temperature compensation units;
generating a new compensation bias current for compensating the second gain deviation through the temperature compensation object corresponding to the second compensation gear.

19. The bias circuit device of claim 10, wherein the power amplification device further comprises an RC circuit module; the RC circuit module is connected between the bandgap reference module and the power amplifier.

* * * * *